(12) United States Patent
Cao et al.

(10) Patent No.: US 7,887,876 B2
(45) Date of Patent: Feb. 15, 2011

(54) ORGANIC ELECTRONIC DEVICE AND METHOD TO MANUFACTURE SAME

(75) Inventors: Yong Cao, Goleta, CA (US); Gang Yu, Santa Barbara, CA (US)

(73) Assignee: DuPont Displays Inc.

( * ) Notice: Subject to any disclaimer, the term of this patent is extended or adjusted under 35 U.S.C. 154(b) by 1456 days.

(21) Appl. No.: 11/025,749

(22) Filed: Dec. 29, 2004

(65) Prior Publication Data

US 2006/0138402 A1    Jun. 29, 2006

(51) Int. Cl.
*B05D 5/06* (2006.01)
*B32B 19/00* (2006.01)
*B32B 9/00* (2006.01)

(52) U.S. Cl. .......................... 427/66; 428/690; 428/699; 428/917; 428/469

(58) Field of Classification Search ..................... 427/66
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 5,965,281 A | 10/1999 | Cao | |
| 6,197,418 B1* | 3/2001 | Cloots et al. | 428/332 |
| 6,284,435 B1* | 9/2001 | Cao | 430/319 |
| 6,396,209 B1* | 5/2002 | Kido et al. | 313/504 |
| 6,569,544 B1* | 5/2003 | Alain et al. | 428/690 |
| 2002/0021088 A1* | 2/2002 | Howard et al. | 313/504 |
| 2003/0181694 A1* | 9/2003 | Shirane et al. | 536/23.1 |

* cited by examiner

Primary Examiner—Michael Cleveland
Assistant Examiner—Austin Murata

(57) ABSTRACT

An organic electronic device to emit or receive radiation includes a cathode, a first layer including a salt, a second layer including an active organic material, and an anode. A method to manufacture an organic electronic device to emit or receive radiation includes depositing a cathode, depositing a first layer including a salt adjacent the cathode, depositing a second layer including an active organic material adjacent the first layer, and depositing an anode adjacent the second layer. An organic electronic device for emitting or receiving radiation includes a cathode, a first layer including a salt, a second layer including an active organic material, and an anode, the anode being adapted to transmit a significant portion of the radiation to or from the second layer.

7 Claims, 2 Drawing Sheets

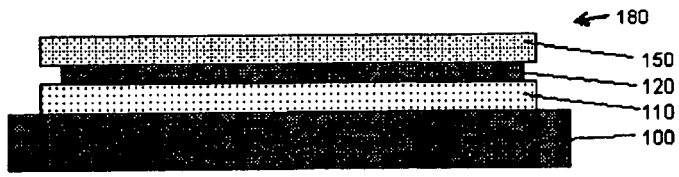
FIG. 1
Prior Art
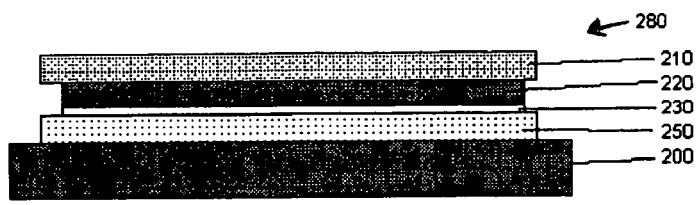
FIG. 2
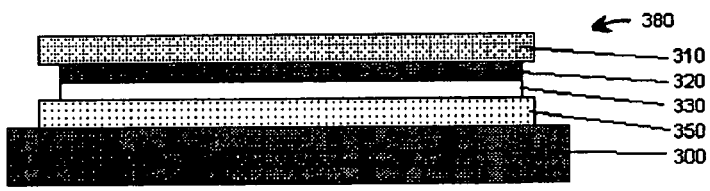
FIG. 3
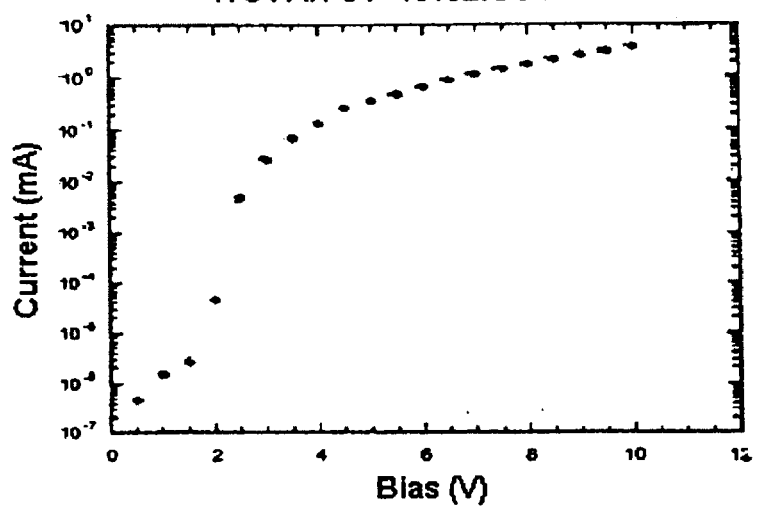
FIG. 4 - IV Graph of Device
ITO / Al / SY+10%LiCO436 / Au

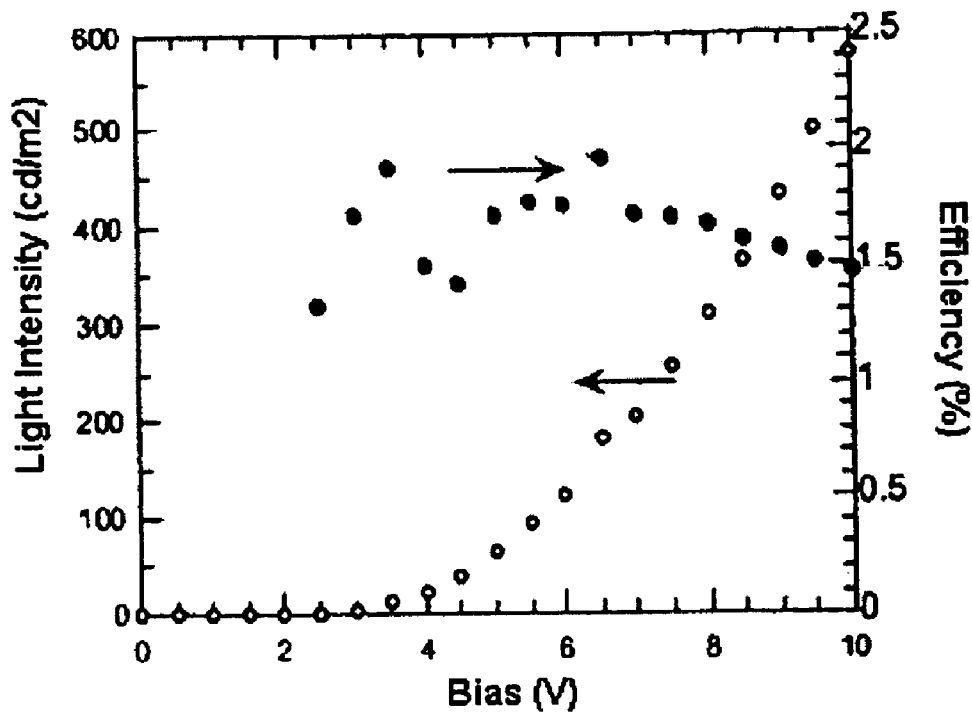
FIG. 5 - Device Performance of Device
ITO / Al / SY+10%LiCO436 / Au
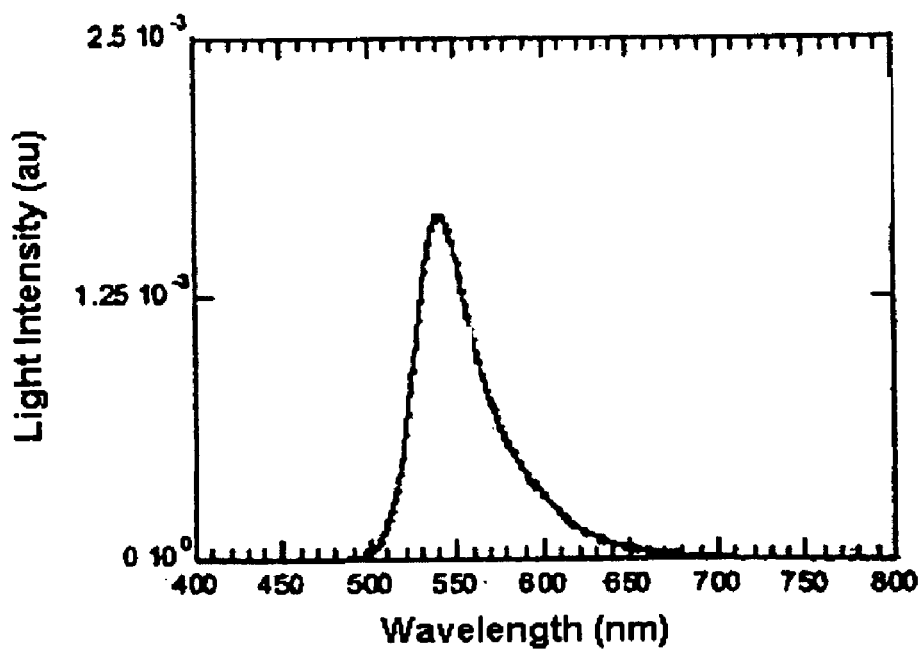
FIG. 6 - Emission Spectrum of Device
ITO / Al / SY+10%LiCO436 / Au

ORGANIC ELECTRONIC DEVICE AND METHOD TO MANUFACTURE SAME

FIELD OF THE INVENTION

The invention relates generally to organic electronic devices, and more specifically to organic electronic devices and processes for forming such organic electronic devices.

BACKGROUND INFORMATION

Organic electronic devices have attracted increased attention in recent years. An example of an organic electronic device includes an organic light emitting diode (OLED). Organic light emitting diodes are promising for a range of applications due to their high power conversion efficiency and low processing costs.

Organic electronic devices may be constructed by depositing a layered structure on a transparent substrate. The layered structure includes a transparent anode layer, at least one active organic layer, and an opaque cathode layer. In this approach, the active organic layer emits or receives radiation through the transparent anode layer and substrate at the bottom of the device, and also may emit from both sides, or on either side (top or bottom) of the device. However, the substrate may contain embedded electrical components, such as pixel drivers and bus lines that reduce the light-emitting or light-receiving area.

Organic electronic devices may also be constructed by depositing a layered structure on a substrate, including an anode layer, at least one active organic layer, and a transparent cathode layer. In this approach, the active organic layer emits or receives radiation through the transparent cathode layer at the top of the device. The emitting or receiving area of this type of organic electronic device is not affected by electrical components embedded within the substrate as described above. In addition, opaque materials may be used to form the substrate. However, materials suitable for construction of the transparent cathode layer may not provide good electron-injection properties for all types of active organic material. Consequently, overall performance of this type of organic electronic device may be adversely affected. Cathode layer materials that provide good electron-injection properties may also be highly reactive in ambient conditions. Accordingly, these materials require encapsulation which may in turn reduce light emission or reception through the cathode layer, and may adversely affect overall performance of this type of organic electronic device.

Organic electronic devices may be constructed by depositing a layered structure on a substrate, including a cathode layer, at least one active organic layer, and a transparent anode layer. In this approach, the active organic layer emits or receives radiation through the transparent anode layer at the top of the device. Cathode layer materials that provide good electron-injection properties may be highly reactive in ambient conditions, or may be highly reactive or incompatible with certain substrate or circuitry contact materials, or with certain processing methods. Accordingly, incorporation of these cathode layer materials into the device at an early fabrication stage may thus increase the complexity and cost of the fabrication process.

There remains a need for an organic electronic device with a light emitting or light-receiving area that remains unaffected by electrical components embedded within the substrate, and that utilizes cathode layer materials which provide suitable electron-injecting properties and are relatively easy to incorporate into the fabrication process.

SUMMARY OF THE INVENTION

In one embodiment, an organic electronic device is produced by depositing a first organic layer adjacent a cathode, wherein the first layer includes a salt; depositing, adjacent the first layer, a second organic layer including an active organic material; and depositing an anode adjacent the second layer.

In another embodiment, a method for forming an organic electronic device that receives or emits radiation includes the steps of depositing a cathode; depositing a first layer adjacent the cathode, wherein the first layer includes a salt; depositing, adjacent the first layer, a second layer that includes an active organic material; and depositing an anode adjacent the second layer, wherein the anode is adapted to receive or emit a significant portion of the radiation.

In another embodiment, an organic electronic device designed to emit or receive radiation includes a cathode; a first layer including a salt; a second layer including an active organic material; and an anode; wherein the anode is adapted to transmit a significant portion of the radiation to or from the second layer; the first layer lies between the cathode and the second layer; and the second layer lies between the first layer and the anode.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

FIG. 1 is a schematic cross-sectional view of an organic electronic device.

FIG. 2 is a schematic cross-sectional view of an organic electronic device, representing an embodiment of the invention.

FIG. 3 is a schematic cross-sectional view of an organic electronic device, representing another embodiment of the invention.

FIG. 4 is a graph of the current-voltage (I-V) characteristics of an organic electronic device, representing another embodiment of the invention.

FIG. 5 is a graph of light intensity and external quantum efficiency as a function of voltage of the organic electronic device of FIG. 4.

FIG. 6 is a graph of the emission spectrum of the organic electronic device of FIG. 4 and FIG. 5.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range. It is to be understood that the elements in the figures are not necessarily drawn to scale. For example, the dimensions of some of the elements in the figures may be exaggerated relative to other elements to assist in an understanding of the embodiments of the invention.

DETAILED DESCRIPTION

Other features and advantages of the invention will be apparent from the following detailed description, and from the claims.

In one embodiment, an organic electronic device is produced by depositing a first organic layer adjacent a cathode, wherein the first layer includes a salt; depositing, adjacent the first layer, a second organic layer including an active organic material; and depositing an anode adjacent the second layer. The first organic layer may be formed during liquid deposition of the second organic layer, and may be formed prior to the second organic layer. The second organic layer may further include a salt. The cathode may not include any Group 1 or Group 2 elemental metal or an alloy comprising a Group 1 or Group 2 element. The cathode may be exposed water or an alcohol. The second organic layer may include an active organic material, wherein the anode is adapted to receive or emit radiation. The salt may include a cationic portion that is selected from a group consisting of ammonia and a metal. The salt may include an anionic portion that is selected from a group consisting of a phosphate and a sulfate.

In another embodiment, a method for forming an organic electronic device that receives or emits radiation includes the steps of depositing a cathode; depositing a first layer adjacent the cathode, wherein the first layer includes a salt; depositing, adjacent the first layer, a second layer that includes an active organic material; and depositing an anode adjacent the second layer, wherein the anode is adapted to receive or emit a significant portion of the radiation. The first layer may further include an organic material, or only a salt. The second layer may further include a salt. The first layer may be formed during liquid deposition of the second layer. The first layer may be separately formed prior to the second layer. The cathode may be exposed to water or an alcohol.

In another embodiment, an organic electronic device designed to emit or receive radiation includes a cathode; a first layer including a salt; a second layer including an active organic material; and an anode; wherein the anode is adapted to transmit a significant portion of the radiation to or from the second layer; the first layer lies between the cathode and the second layer; and the second layer lies between the first layer and the anode. The first layer may further include an organic material, or may include only a salt. The second layer may include a salt. The cathode may not include any Group 1 or Group 2 elemental metal or an alloy comprising a Group 1 or Group 2 element. The salt may be organic or inorganic. The cathode may be adapted to transmit a significant portion of the radiation to or from the second layer.

DEFINITIONS

Before addressing further details of the embodiments described below, various terms are herein defined.

As used herein, the terms "organic electronic device" or "electronic device" are intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronics process (e.g., a photodetector, a photoconductive cell, a photoresistor, a photoswitch, a phototransistor, a phototube, an infrared ("IR") detector, or a biosensor), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In one embodiment, the compositions are deposited to form electrically conductive or semiconductive layers which are used alone or in a combination of one or more electrodes, one or more electroactive components, one ore more photoactive components, or one or more bioactive components. As used herein, the terms "electroactive component", "photoactive component", or "bioactive component" refer to a component which exhibits the predetermined activity in response to a stimulus, such as an electromagnetic field, an electrical potential, solar energy radiation, biostimulation field, or any combination thereof.

The term "layer" is used interchangeably with the term "film" and refers to a coating covering a desired area. The term is not limited by size. The area can be as large as the entire device or as small as a specific functional area such as the actual visual display, or as small as a single sub-pixel. Layers and films can be formed by any conventional deposition technique, including vapor deposition and liquid deposition (continuous and discontinuous techniques) and thermal transfer. Continuous deposition techniques, include but are not limited to spin coating, gravure coating, curtain coating, dip coating, slot-die coating, spray coating, and continouous nozzle coating. Discontinuous deposition techniques include, but are not limited to ink jet printing, gravure printing, and screen printing.

The term "active" when referring to a layer or material is intended to mean a layer or material that exhibits electronic or electro-radiative properties. An organic layer, including an active material, may emit radiation or exhibit a change in concentration of electron-hole pairs when receiving radiation.

The term "active material" refers to a material which electronically facilitates the operation of a device. Examples of active organic materials include, but are not limited to materials which conduct, inject, transport, or block a charge, and may emit radiation, where the charge can be either an electron or a hole. Examples of active organic materials also include materials that emit light upon the application of a charge and may be small molecules, organo-metallic compounds, semi-conducting compounds, or polymers. Examples of inactive materials include, but are not limited to planarization materials, insulating materials, and environmental barrier materials.

The term "adjacent" does not necessarily mean that a layer, member or structure is immediately next to another layer, member or structure. A combination of layer(s), member(s), or structure(s) that directly contact each other are still adjacent each other.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-sensing component" is intended to mean an electronic component, which can sense radiation at a targeted wavelength or spectrum of wavelengths. The radiation may be within the visible-light spectrum or outside the visible-light spectrum (UV or IR). An IR sensor is an example of a radiation-sensing component.

The term "salt" is intended to mean a compound, which, when in an anhydrous form, includes a cationic portion and an anionic portion, and when placed in an aqueous solution can generate a cation from the cationic portion and an anion from an anionic portion. For example, sodium acetate include a cationic portion (Na) and an anionic portion ($CH_3COO$), and when added to water can generation a cation ($Na^+$) and an anion ($CH_3COO^-$).

The term "elemental metal" when referring to a layer or a material refers to a metal-containing layer or material that consists essentially of a single element and is not a homogenous alloy with another metallic element or a molecular compound with another element.

The term "charge transport" when referring to a layer, material, member, or structure is intended to mean such layer, material, member or structure that facilitates migration of such charge through the thickness of such layer, material, member or structure with relative efficiency and small loss of charge.

The term "electron transport means, when referring to a layer, material, member or structure, such a layer, material, member or structure that promotes or facilitates migration of negative charge through such a layer, material, member or structure.

The term "hole transport" means, when referring to a layer, material, member or structure, such a layer, material, member or structure that facilitates migration of positive charges through the thickness of such layer, material, member or structure with relative efficiency and small loss of charge.

The term "polymer" is intended to mean a material having at least one repeating monomeric unit. The term includes homopolymers having only one kind of monomeric unit, and copolymers having two or more different monomeric units. Copolymers are a subset of polymers.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct connection between electronic component(s), circuit(s) or electronic component(s) or circuit(s) with switch(es) (e.g., transistor(s)) connected between them.

The term "substantially" is intended to mean largely but not necessarily wholly that which is specified.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). The term "on" as in A "on" B shall mean, either directly "on", i.e., A in physical contact with B, or A is indirectly in contact with B, through another material or layer.

The terms "a" or "an" as used herein are to describe elements and components of the invention. This is done merely for convenience and to give a general sense of the invention. This description should be read to include one or at least one and the singular also includes the plural unless it is obvious that it is meant otherwise.

Group numbers corresponding to columns within the periodic table of the elements use the "New Notation" convention as seen in the CRC Handbook of Chemistry and Physics, 81$^{st}$ Edition (2000).

To the extent not described herein, many details regarding specific materials, processing acts, and circuits are conventional and may be found in textbooks and other sources within the organic light-emitting display, photodetector, semiconductor and microelectronic circuit arts.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Structure of the Organic Electronic Device

Referring now to FIG. 1, a schematic cross-sectional view of an organic electronic device 180 is illustrated. A transparent substrate 100 is provided as a base for the device 180. A transparent anode layer 110 is coupled with the substrate 100. An organic layer 120 is coupled with the transparent anode layer 110. Alternatively, a charge transport layer can also be coupled between the transparent anode layer 110 and the organic layer 120. A cathode layer 150 is coupled with the organic layer 120. Alternatively, a charge transport layer can be coupled between the organic layer 120 and the cathode layer 150. Radiation is emitted or received through the transparent anode layer 110 and transparent substrate 100 at the bottom of the device 180.

FIG. 2 is a schematic cross-sectional view of an organic electronic device 280, representing an embodiment of the invention. A substrate 200 serves as the initial base material for the device 280. A cathode layer 250 is coupled with the substrate 200. An organic layer 220 is coupled with the cathode layer 250 using a liquid deposition process. The organic layer 220 comprises a salt admixed with an active organic material. Using a liquid deposition process to couple the organic layer 220 with the cathode layer 250 results in the formation of a thin salt interface layer 230 between the organic layer 220 and the cathode layer 250. An anode layer 210 adapted to receive or emit radiation is coupled with the organic layer 220. Radiation is emitted or received through the anode layer 210 at the top of the device 280.

The organic electronic device 280 of FIG. 2 may be fabricated in the following manner. A substrate is provided as the base or support of the device. The substrate material can be flexible or rigid, organic or inorganic. Glass or flexible organic films may suitably be used as a substrate. When the substrate is an organic film, it may include one or more additional layers to provide environmental protection, such as thin layers of metals, ceramics, or glasses.

A cathode layer is coupled to the substrate, using a liquid deposition process or a chemical or physical vapor deposition process. Liquid deposition processes include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as e-beam evaporation and resistance evaporation. Specific forms of physical vapor deposition include RF magnetron sputtering or inductively-coupled plasma physical vapor deposition ("IMP-PVD").

The cathode layer is an electrode layer that is particularly efficient for injecting electrons or negative charge carriers. Materials that provide suitable electron injection properties for the cathode layer can be selected from Group 1 alkali metals or Group 2 alkaline earth metals. However, these materials may be highly reactive in ambient conditions, and also may be incompatible with certain processing methods, such as those that include exposure to water or alcohol. Accordingly, use of such materials may increase the complexity and cost of the fabrication process.

Alternatively, materials such as the Group 12 metals, Group 13 metals, rare earth metals, the lanthanides, the actinides, mixed metals and alloys thereof can also be used for the cathode layer. In particular, stable materials that have lower electron injection properties than Group 1 and Group 2 metals, including but not limited to gold, copper, indium, silver, and particularly aluminum, can be used in conjunction with the salt interface layer to provide high performance devices comparable or superior to devices using Group 1 or Group 2 metals. Specific advantages of stable cathode layer materials include compatibility with certain processing methods, such as those that include exposure to water or alcohol, and compatibility with commonly used substrate and circuitry contact materials. The use of stable cathode layer materials adds relatively little complexity to the fabrication process.

In one embodiment, a transparent substrate and a cathode layer adapted to emit or receive radiation can be used. The cathode layer may be adapted to emit or receive radiation by, as a non-limiting example, altering the thickness of the cathode layer. In this embodiment, radiation may be emitted or received by the organic electronic device through the substrate and cathode layer at the bottom of the device. An anode layer adapted to emit or receive radiation can also be used. In this embodiment, radiation may be emitted or received by the organic electronic device through either the substrate and cathode layer at the bottom of the device, or through the anode layer at the top of the device.

An organic layer comprising a salt and an active organic material is coupled with the cathode layer using a liquid deposition process, such as spin coating, ink jet printing, or screen printing. Liquid deposition of the organic layer results in the formation of a thin salt interface layer between the organic layer and the cathode layer. The salt interface layer acts to improve electron-injection from the cathode layer into the organic layer, permits the use of a range of cathode layer materials, and increases device performance.

The organic layer comprising a salt admixed with an active organic material may be a homogenous mixture that may be prepared using several different methods including, but not limited to: milling a salt and an active organic material together as solids; melting one or both of a salt and an active organic material and mixing as a liquid; in-situ polymerization of a monomeric or prepolymeric active organic material in the presence of a salt; or suspension of each a salt and an active organic material in liquid, mixing the liquid and removing the liquid. The organic layer comprises a major proportion by weight of an active organic material, and a minor proportion by weight of a salt. In an embodiment, the organic layer comprises less than 50% by weight of a salt. In another embodiment, the organic layer comprises between 5% and 25% by weight of a salt. In another embodiment, the organic layer comprises about 20 percent by weight of a salt. The organic layer comprising a salt admixed with an active organic material can also include additional materials, such as bulk structural polymers, processing aids, or other organic materials.

The active organic material can include any organic radiation-emitting or radiation-sensing material including, but not limited to, small molecule materials such as those described in U.S. Pat. No. 4,356,429 and U.S. Pat. No. 4,539,507, and polymeric materials such as those described in U.S. Pat. No. 5,247,190, U.S. Pat. No. 5,408,109, and U.S. Pat. No. 5,317,169. Exemplary materials include, but are not limited to, conjugated polymers such as those described in U.S. Pat. No. 6,284,435. Representative examples of conjugated polymers include poly(phenylenevinylenes), poly(arylene vinylenes), poly(p-phenylenes), poly(arylenes), polyquinolenes, as well as derivatives, copolymers, and mixtures thereof.

In one embodiment, the salt admixed with the active organic material can comprise a salt prepared from an organic anionic surfactant material typically containing a highly polarizable functionality corresponding to a strong acid such as a sulfate or a phosphate. The organic anionic surfactant material can be an organo sulfate or a mono- or diorgano phosphate, also referred to by the group names "ether sulfate" or "ether phosphate", respectively. Anionic ether sulfate and ether phosphate surfactants may be commercially produced and may be used as high foaming detergents in consumer products.

In one embodiment, the salt may be prepared from commercially available surfactant products according to the method described in U.S. Pat. No. 6,284,435. Representative examples of commercial ether sulfates include, but are not limited to, Rhone-Poulenc Alipal CO436, Rhone-Poulenc Rhodapex ESY, Cyanamid Aerosol NPES 458, and Pilot Calform EA-603. Representative examples of commercial ether phosphates include Rhone-Poulenc Rodafac RE-410 and Rhone-Poulenc Rodafac PL-620. The salts are referred to herein by using the product name plus "Li", for example, LiCO436 is the lithium salt of Rhone-Poulenc Alipal CO436. Other specific salts such as barium salts are represented in the same way, for example BaCO436, etc. In one embodiment, the salt may be an inorganic salt.

An anode layer is coupled with the organic layer by a liquid deposition process, or by chemical or physical vapor deposition. The anode layer is an electrode layer that is more efficient for injecting holes as compared to the cathode layer. The anode layer can include materials containing a metal, mixed metal, alloy, metal oxide or mixed-metal oxide. Suitable metals include the Group 11 metals, the metals in Groups 4, 5, and 6, and the Group 8-10 transition metals. Alternatively, to adapt the anode layer to receive or emit radiation, mixed-metal oxides of Groups 12, 13 and 14 metals, such as indium-tin-oxide, may be used. Some non-limiting, specific examples of materials for anode layer include indium-tin-oxide ("ITO"), aluminum-tin-oxide, gold, silver, copper, nickel, and selenium. In addition, the anode layer may also include an organic material such as polyaniline.

The device may also include one or more charge transport layers between the organic layer and the anode layer to facilitate hole injection and/or transport. The charge transport layers can be formed using a liquid deposition process, by thermal patterning, or by chemical or physical vapor deposition. Examples of materials which may facilitate hole-injection/transport comprise N,N'-diphenyl-N,N'-bis(3-methylphenyl)-[1,1'-biphenyl]-4,4'-diamine (TPD) and bis[4-(N,N-diethylamino)-2-methylphenyl](4-methylphenyl)methane (MPMP); hole-transport polymers such as polyvinylcarbazole (PVK), (phenylmethyl)polysilane, poly(3,4-ethylenedioxythiophene) (PEDOT), and polyaniline (PANI), or the like; electron and hole-transporting materials such as 4,4'-N,N'-dicarbazole biphenyl (BCP); or light-emitting materials with good hole-transport properties such as chelated oxinoid compounds, including tris(8-hydroxyquinolato)aluminum ($Alq_3$) or the like.

The organic electronic device of FIG. 2 can emit radiation by applying a forward bias equal to or greater than approximately 2V between the cathode layer and the anode layer. Radiation is emitted through the anode layer adapted to emit or receive radiation at the top of the device. Alternatively, radiation may be emitted through a transparent substrate and a cathode layer adapted to emit or receive radiation at the bottom of the device. The organic electronic device may also be configured to emit or receive radiation through both the top and bottom of the device simultaneously.

FIG. 3 is a schematic cross-sectional view of an organic electronic device 380, representing another embodiment of the invention. A substrate 300 serves as the initial base material for the device 380. A cathode layer 350 is coupled with the substrate 300. A salt interface layer 330 is coupled with the cathode layer 350. The salt interface layer 330 comprises a salt or a mixture thereof. An organic layer 320 is coupled with the salt interface layer 330. The organic layer 320 can comprise a salt admixed with an active organic material. Alternatively, the organic layer 320 can comprise an active organic material or a mixture thereof that does not include a salt. An anode layer 310 adapted to receive or emit radiation is coupled with the organic layer 320. Radiation is emitted or received through the anode 310 at the top of the device 380. The top emission structure is suitable for active matrix polymer light emitting devices (AMPLEDs) for organic electronic devices with high pixel content (e.g., more than 320×240× RGB) such as HDTVs, and for passive matrix pixilated display arrays.

The organic electronic device of FIG. 3 can be fabricated in a manner similar to the device described above in reference to FIG. 2, with the following difference. In this embodiment of the invention a salt interface layer comprising a salt or a mixture thereof is coupled to the cathode layer prior to and separately from the organic layer. The substrate, cathode layer, and anode layer may include the materials and may also be formed as described above in reference to FIG. 2.

The salt interface layer comprising a salt or mixture thereof is coupled to the cathode layer using a liquid deposition process. The salt interface layer can comprise a pure organic or inorganic salt, or can include additional material, including organic material, such as a charge transport material which facilitates electron injection and/or transport. Examples of materials which may facilitate electron-injection/transport comprise metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, these materials may be inorganic and comprise BaO, LiF, $Li_2O$, or the like.

The organic layer is coupled to the salt interface layer using a liquid deposition process. Alternatively, the organic layer 320 of FIG. 3 can also be formed by thermal patterning, or chemical or physical vapor deposition. The organic layer may include a salt admixed with an active organic material. The organic layer can also include an active organic material or a mixture thereof that does not include a salt.

The organic electronic device illustrated in FIG. 3 can emit radiation as described above in reference to FIG. 2. Similarly, the organic electronic device may be configured to emit or receive radiation at the top of the device, at the bottom of the device, or simultaneously at both the top and the bottom of the device as described above. Top emission structure is desired in AMPLEDs, for which the method and device herein disclosed is suited.

Although the embodiments depicted in FIG. 2 and FIG. 3 include an organic electronic device that includes a layered structure including one or two organic layers and two electrode layers, this is for illustrative purposes only. In other embodiments, one or more additional layers can be present within the organic electronic device. For example, a layer between a hole-injection/transport layer and the organic layer may facilitate positive charge transport, band-gap matching of the layers, function as a protective layer, or the like. Layers that are known in the art can be used. In addition, any of the above-described layers can be made of two or more layers. The choice of materials for each of the component layers may be determined by balancing the goals of providing a device with high device performance with the cost of fabrication, fabrication complexities, or potentially other factors.

EXAMPLES

The following examples are meant to illustrate and not limit the scope of the invention.

Example 1

This Example demonstrates the fabrication of an organic light emitting device that includes both a separately coupled salt interface layer and an organic layer comprising a salt admixed with an active organic material.

An organic light emitting device is fabricated in the following manner. An indium-tin oxide (ITO) coated glass substrate is used as a base material for the device. An aluminum cathode layer (30-200 nm) is first deposited onto the ITO coated substrate. 0.03 mL of 10% (w/V) tetra(oxy-1,2-ethanediyl), α-sulfo-ω-(nonylphenoxy)-lithium salt in xylene is added into 5 ml of 1.5% GK-2 (Dow). A thin salt interface layer (1-10 nm) comprising the lithium nonylphenyl tetraethyleneoxide sulfate (LiCO436) in 1.5% solution in xylene is then spin-coated onto the aluminum cathode layer. Next, an organic layer (800 nm) comprising GK-2 (Dow) containing 20% (w/w) of lithium nonylphenyl tetraethyleneoxide sulfate (GK-2 with 20% LiCO436) is spin-coated onto the salt interface layer. Finally, the coated substrate is transferred into a thermal evaporator wherein a gold anode layer (30 nm) is deposited by thermal evaporation on top of the organic layer.

Application of voltage between the ITO/aluminum layer and gold layer wherein the ITO/aluminum layer is configured as the negative terminal results in emission of a yellow-green light from the top (anode) side of the device. No light is observed when the ITO/aluminum layer is configured as the positive terminal.

Example 2

This Example demonstrates the performance of an organic light emitting device that includes an organic layer comprising a salt admixed with an active organic material.

An organic light emitting device is fabricated similarly to Example 1, with the following differences: the salt interface layer is not coupled to the cathode layer separately from the organic layer, and the organic layer comprises 0.1 part (w/w) LiCO436 per part SY-132 polymer (SY with 10% LiCO436) spin-cast onto the aluminum cathode layer. In this example, the salt interface layer self-forms during liquid deposition of the organic layer onto the aluminum cathode layer.

FIG. 4 is a graph of the current-voltage (I-V) characteristics of such a device between 0 and +12V. The graph shows the onset of electron-injection at approximately 2V, indicating that barrier height of the aluminum cathode layer is substantially decreased by the presence of the salt and resulting salt interface layer. The rectification ratio is larger than $10^4$. FIG. 5 is a graph of the light intensity and external quantum efficiency of such a device between 0 and +10V. Light output is nearly 600 cd/m$^2$ at 10V. External quantum efficiency is as high as 2%. FIG. 6 is a graph of the emission spectrum collected from the top (anode) side of such a device between 400 nm and 800 nm. The emission spectrum band is substantially decreased in comparison to conventional organic light emitting devices due to weak cavity effect. Decreased emission spectrum band is a favorable feature for full-color displays whereby it is possible to control emission quality by variation of the thickness of the electrode layers.

This example demonstrates that the presence of small amounts of surfactant additive enables the fabrication of highly efficient polymer light-emitting diodes with top emission form the anode side.

Example 3

This Example demonstrates the external quantum efficiency of organic light emitting devices that include an organic layer comprising a salt admixed with an active organic material.

Organic light emitting devices are fabricated according to Example 2 for a range of organic layers comprising different salts admixed with different active organic materials. The organic layers comprise 0.2 part (w/w) salt per part active organic material. Table 1 lists device performance data obtained for these organic light emitting devices.

TABLE 1

Performance of as-prepared aluminum cathode layer devices with 0.2 part (w/w) salt per part active organic material for a range of salts and active organic materials at 200 cd/m$^2$

| Active Organic Material | Salt | λmax (nm) | Voltage (V) | Efficiency (cd/A) |
|---|---|---|---|---|
| SCB-11 | BaCO436 | 461 | 4.98 | 3.7 |
| SCB-11 | LiCO436 | 461 | 8.46 | 1.2 |
| GK-2 | LiCO436 | 534 | 6.40 | 6.6 |
| GK-2 | BaCO436 | 534 | 4.70 | 3.2 |
| GK-2 | LiCO436 | 534 | 7.46 | 3.7 |
| SY-132 | LiCO436 | 550 | 9.96 | 3.44 |
| MEH-PPV | LiCO436 | 590 | 4.46 | 2.0 |
| MEH-PPV | BaCO436 | 590 | 3.58 | 2.3 |
| AEF2157 | BaCO436 | 625 | 5.64 | 0.9 |
| AEF2157 | LiCO436 | 625 | 8.30 | 0.24 |

Example 4

This Example demonstrates improved performance of organic light emitting devices that include an organic layer comprising a salt admixed with an active organic material as compared to organic light emitting devices that do not include a salt, either in the organic layer or as a separate salt interface layer.

Organic light emitting devices are fabricated according to Example 2 for a range of organic layers comprising a salt LiCO436 admixed with different active organic materials. The organic layers comprise 0.2 part (w/w) salt LiCO436 per part active organic material. Table 2 lists the open circuit voltage data obtained for these organic light emitting devices.

These data show that the presence of a salt in the organic light emitting device dramatically changes the interface properties between the cathode layer and the organic layer. The increase in open circuit voltage demonstrates that the salt interface layer significantly improves electron injection.

TABLE 2

Open-circuit voltage of as-prepared aluminum cathode layer devices under 360 nm UV light excitation with and without salt

| Active Organic Material | Salt | λmax (nm) | Open-Circuit Voltage (V) |
|---|---|---|---|
| SCB-11 | LiCO436 | 461 | 1.90 |
| SCB-11 | None | 461 | 0.99 |
| GK-2 | LiCO436 | 534 | 2.00 |
| GK-2 | None | 534 | 1.15 |
| MEH-PPV | LiCO436 | 590 | 1.70 |
| MEH-PPV | None | 590 | 1.00 |
| AEF2157 | LiCO436 | 625 | 1.65 |
| AEF2157 | None | 625 | 1.40 |

Example 5

This Example demonstrates the fabrication of an organic light emitting device that includes both a separately coupled salt interface layer and an organic layer comprising an active organic material.

An organic light emitting device is fabricated similarly to Example 1, with the following difference: the organic layer comprises a small molecule active organic material, tris(8-hydroxyquinolato)aluminum (Alq$_3$), and does not contain a salt.

An indium-tin oxide (ITO) coated glass substrate is used as a base material for the device. An aluminum cathode layer is first deposited onto the ITO coated substrate. A thin salt interface layer comprising LiCO436 is then spin-coated onto the aluminum cathode layer. Next, an organic layer (88 nm) comprising Alq3 is thermally deposited onto the salt interface layer. Finally, a gold anode layer (50 nm) is thermally deposited on top of the organic layer.

Performance data for such a device shows external quantum efficiency of 1.48% and luminous efficiency of 2.5 cd/m$^2$ at 12.8V.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments.

However, the benefits, advantages, solutions to problems, and any elements that may cause any benefit, advantage, or solution to occur or become more pronounced are not to be construed as a critical, required, or essential feature or element of any or all the claims.

What is claimed is:

1. A method of forming an organic electronic device that receives or emits radiation, comprising the steps of:
   depositing a cathode;
   depositing a first layer adjacent the cathode, wherein the first layer comprises a salt;
   depositing, adjacent the first layer, a second layer comprising an active organic material; and
   depositing an anode adjacent the second layer, wherein the anode is adapted to receive or emit a significant portion of the radiation.

2. The method of claim 1 wherein the first layer further comprises an organic material.

3. The method of claim 1 wherein the first layer comprises only a salt.

4. The method of claim 3 further comprising exposing the cathode to water or an alcohol.

5. The method of claim 1 wherein the second layer further comprises a salt.

6. The method of claim 1 wherein the first layer is formed during liquid deposition of the second layer.

7. The method of claim 1 wherein the first layer is separately formed prior to the second layer.

* * * * *